(12) United States Patent
Lealman et al.

(10) Patent No.: US 9,423,565 B2
(45) Date of Patent: Aug. 23, 2016

(54) COUPLED WAVEGUIDE APPARATUS AND STRUCTURES THEREFOR

(71) Applicant: The Centre for Integrated Photonics Ltd., Ipswich, Suffolk (GB)

(72) Inventors: Ian Lealman, Ipswich (GB); Michael Robertson, Ipswich (GB)

(73) Assignee: The Centre for Integrated Photonics, Ltd., Ipswich, Suffolk (GB)

( * ) Notice: Subject to any disclaimer, the term of this patent is extended or adjusted under 35 U.S.C. 154(b) by 0 days.

(21) Appl. No.: 14/159,886

(22) Filed: Jan. 21, 2014

(65) Prior Publication Data

US 2014/0133817 A1   May 15, 2014

Related U.S. Application Data

(63) Continuation of application No. PCT/CN2012/078886, filed on Jul. 19, 2012.

(30) Foreign Application Priority Data

Jul. 19, 2011   (GB) .................................. 1112428.6

(51) Int. Cl.
  *G02B 6/10*   (2006.01)
  *G02B 6/26*   (2006.01)
  (Continued)

(52) U.S. Cl.
  CPC . *G02B 6/24* (2013.01); *B82Y 20/00* (2013.01); *G02B 6/124* (2013.01); *G02B 6/1228* (2013.01); *G02B 6/136* (2013.01); *G02B 6/29316* (2013.01); *H01S 5/1014* (2013.01);
  (Continued)

(58) Field of Classification Search
  CPC ............................ G02B 6/1228; H01S 5/1014
  See application file for complete search history.

(56) References Cited

U.S. PATENT DOCUMENTS 5,985,685 A   11/1999 Lealman et al.
6,282,345 B1 *   8/2001 Schimpe .......................... 385/50

(Continued)

FOREIGN PATENT DOCUMENTS

CN   101641622 A   2/2010

OTHER PUBLICATIONS

Foreign Communication From a Counterpart Application, PCT Application No. PCT/CN2012/078886, International Search Report dated Nov. 1, 2012, 7 pages.

(Continued)

*Primary Examiner* — Omar R Rojas
(74) *Attorney, Agent, or Firm* — Conley Rose, P.C.; Grant Rodolph

(57) ABSTRACT

Planar waveguide apparatus provides a waveguide at least partially overlying a passive buried rib waveguide for coupling optical radiation there between. The overlying waveguide has at least one tapered section, the width of the taper determining the degree of coupling between the waveguides at points along the tapered section. The overlying waveguide may have an active core region. The passive buried rib may have one or more unguided sections below electrically driven regions of the active waveguide to avoid parasitic modes and/or may provide a grating for use as a filter or feedback. Variations include a branched passive waveguide for coupling to two or more overlying waveguides and two or more aligned and active overlying waveguides coupling to one passive waveguide, there being a break in a shared core region of the active waveguides to provide electrical isolation between them.

25 Claims, 8 Drawing Sheets

(51) Int. Cl.
*G02B 6/24* (2006.01)
*H01S 5/10* (2006.01)
*G02B 6/122* (2006.01)
*G02B 6/124* (2006.01)
*G02B 6/293* (2006.01)
*G02B 6/136* (2006.01)
*B82Y 20/00* (2011.01)
*H01S 5/026* (2006.01)
*H01S 5/125* (2006.01)
*H01S 5/22* (2006.01)
*H01S 5/343* (2006.01)
*G02B 6/12* (2006.01)

(52) U.S. Cl.
CPC ......... *H01S5/1032* (2013.01); *G02B 2006/121* (2013.01); *G02B 2006/12097* (2013.01); *H01S 5/026* (2013.01); *H01S 5/1007* (2013.01); *H01S 5/1021* (2013.01); *H01S 5/1025* (2013.01); *H01S 5/1085* (2013.01); *H01S 5/125* (2013.01); *H01S 5/22* (2013.01); *H01S 5/34306* (2013.01); *H01S 2301/185* (2013.01)

(56) References Cited

U.S. PATENT DOCUMENTS

| | | | |
|---|---|---|---|
| 6,766,092 B2 * | 7/2004 | Stellmacher | 385/131 |
| 6,826,345 B1 * | 11/2004 | Zhong | G02B 6/126 385/129 |
| 2003/0053756 A1 | 3/2003 | Lam et al. | |
| 2004/0264905 A1 | 12/2004 | Blauvelt et al. | |
| 2005/0084991 A1 | 4/2005 | Lee et al. | |
| 2009/0003770 A1 | 1/2009 | Gill et al. | |
| 2010/0040327 A1 | 2/2010 | Deki et al. | |
| 2012/0294566 A1 * | 11/2012 | Ho et al. | 385/14 |

OTHER PUBLICATIONS

Foreign Communication From a Counterpart Application, PCT Application No. PCT/CN2012/078886, Written Opinion dated Nov. 1, 2012, 3 pages.

* cited by examiner

COUPLED WAVEGUIDE APPARATUS AND STRUCTURES THEREFOR

CROSS-REFERENCE TO RELATED APPLICATIONS

This application is a continuation of International Application No. PCT/CN2012/078886, filed on Jul. 19, 2012, which claims priority to British Patent Application No. GB1112428.6, filed on Jul. 19, 2011, both of which are hereby incorporated by reference in their entireties.

TECHNICAL FIELD

The present invention relates to coupled waveguide apparatus and structures therefor, for use in optoelectronic device structures, assemblies or systems, and to a method of making such apparatus and structures. Embodiments of the invention find particular application in optical mode expansion for active devices, for example for use in photonic integration.

BACKGROUND

It is known to use coupled waveguides to deliver optical radiation from one device or structure to another and to use characteristics of the coupled waveguides to improve that delivery.

For example, semiconductor optical devices historically have had very small waveguide modes and optical fibers have tended to have much larger waveguide modes, for instance of the order of tenfold. The mismatch in mode size leads to very low coupling efficiencies between waveguide and fiber.

It is known to use a secondary waveguide in order to expand the mode spot size of a semiconductor optical device. Examples are disclosed in U.S. Pat. Nos. 5,985,685 and 6,282,345. However, these have suffered from problems such as a relatively low fabrication yield, reproducibility and/or performance, which can lead to expensive production costs.

SUMMARY

According to a first aspect of embodiments of the present invention, there is provided planar waveguide apparatus for coupling optical radiation between waveguides supported by a substrate, the apparatus comprising a passive waveguide and a waveguide at least partially overlying the passive waveguide with respect to the substrate, the overlying waveguide having at least one tapered section to support the coupling between the overlying waveguide and the passive waveguide, in use of the apparatus, and the passive waveguide comprising a core layer and cladding material, wherein the passive waveguide comprises, in cross section, a rib of core material surrounded on all sides by the cladding material to provide a buried rib waveguide.

The cladding material in practice may be fabricated in layers, each layer containing one or more different materials.

Using a passive waveguide structure in which a core layer is completely etched through on either side and then buried in cladding material overcomes problems such as critical dependency on etch depth and overgrowth of exposed quaternary layers, as shown in U.S. Pat. No. 6,282,345.

The overlying waveguide may comprise active material to provide optical gain, in use. Such a waveguide may then be embodied as an active device such as a semiconductor optical amplifier (SOA) or a laser.

The tapered section might be tapered in one or more dimensions. In many known fabrication techniques, such as lithography, it will conveniently be tapered in a plane parallel or substantially parallel to a substrate, but this is not essential. It is only important that the taper supports coupling of at least one optical mode between the overlying waveguide and the passive waveguide.

In many embodiments, it will be convenient that the passive waveguide provides mode expansion with respect to the overlying waveguide. This allows optical radiation to be coupled between an overlying waveguide with perhaps tight confinement, such as a SOA or a laser, and a waveguide with a larger mode spot size such as an optical fiber.

In most cases, effective coupling will be best achieved if the propagation directions of the tapered section of the overlying waveguide and a portion of the buried rib waveguide with which coupling occurs, in use of the apparatus, are parallel or at least follow substantially the same path. However, there may be arrangements in which the propagation directions are not exactly or consistently the same.

Where the passive waveguide and the overlying waveguide extend within coupling distance of each other, it is possible that one or more parasitic modes will propagate. (In this situation, a parasitic mode will be, for example, an unwanted optical mode that is left in the passive waveguide due to incomplete mode transfer to the overlying waveguide.) A break or termination in the passive waveguide providing at least one unguided region in relation to the overlying waveguide may reduce or avoid this parasitic mode or modes in use of the apparatus. Such a break or termination might be provided particularly by a break, or space, in the core layer of the passive waveguide and is preferably done without affecting one or more modes propagating in the overlying waveguide, in use of the apparatus, for example by changing the mode spot size or shape.

If the overlying waveguide has one or more electrically driven regions, for example if it is incorporated into an active device or waveguide, it might be particularly important to avoid parasitic modes. In this case, at least one unguided region might underlie at least one electrically driven region of the overlying waveguide with respect to the substrate, in use of the apparatus.

The passive waveguide might also provide routing by having at least one curved guiding portion for guiding optical radiation away from a propagation direction of the overlying waveguide. Again, this might be particularly beneficial where a curved guiding portion partially underlies an electrically driven region of the overlying waveguide with respect to the substrate.

Further modifications of the passive waveguide are that it might comprise at least one grating for use as a filter or distributed Bragg reflector. It might be branched for coupling to separate overlying waveguides and that coupling might favor different respective optical propagation modes, such as different polarization modes.

In turn, there may be features introduced by modification of the overlying waveguide(s). For example, a break in the overlying waveguide might provide electrical isolation between two or more electrically driven devices based on or incorporating the overlying waveguide.

According to a second aspect of embodiments of the present invention, there is provided a method of making waveguide apparatus for coupling optical radiation between a tapered waveguide and a passive waveguide, the method comprising the steps of:

a) epitaxially growing a layer structure comprising one or more layers of core material on one or more supporting layers of cladding material;

b) growing at least one further layer of cladding material on the core material;

c) applying a mask and etching through the further layer(s) of cladding material and the core material to the supporting layer to form a rib waveguide structure;

d) removing the mask and burying the rib waveguide structure in one or more burying layers of cladding material to form the passive waveguide; and e) fabricating the tapered waveguide to be supported by the burying layers, which tapered waveguide extends in an axial direction substantially parallel to, and at least partially overlying, the passive waveguide for optical coupling there between, in use.

The tapered waveguide may comprise a waveguide having at least one tapered section, it being the tapered section, which overlies the passive waveguide for optical coupling there between.

BRIEF DESCRIPTION OF THE DRAWINGS

Waveguide apparatus for optical coupling will now be described as embodiments of the invention, by way of example only and with reference to the accompanying figures in which.

It should be noted that the figures are not drawn to scale.

DETAILED DESCRIPTION

Figure 1:
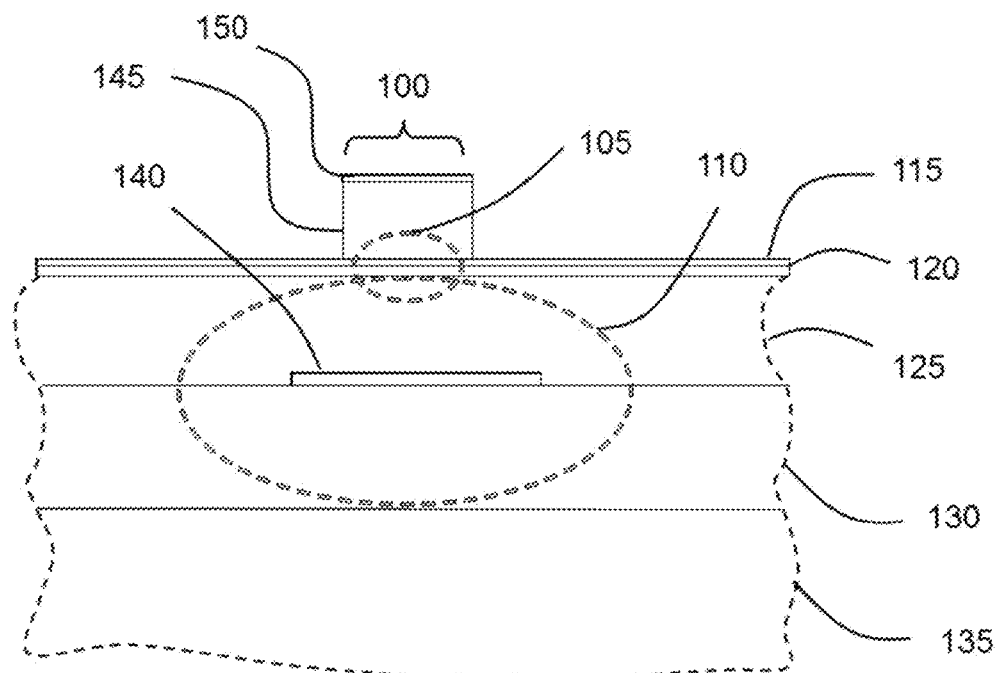
FIG. 1 shows a vertical transverse cross section through a first embodiment of the coupled waveguide apparatus.
Figure 2:
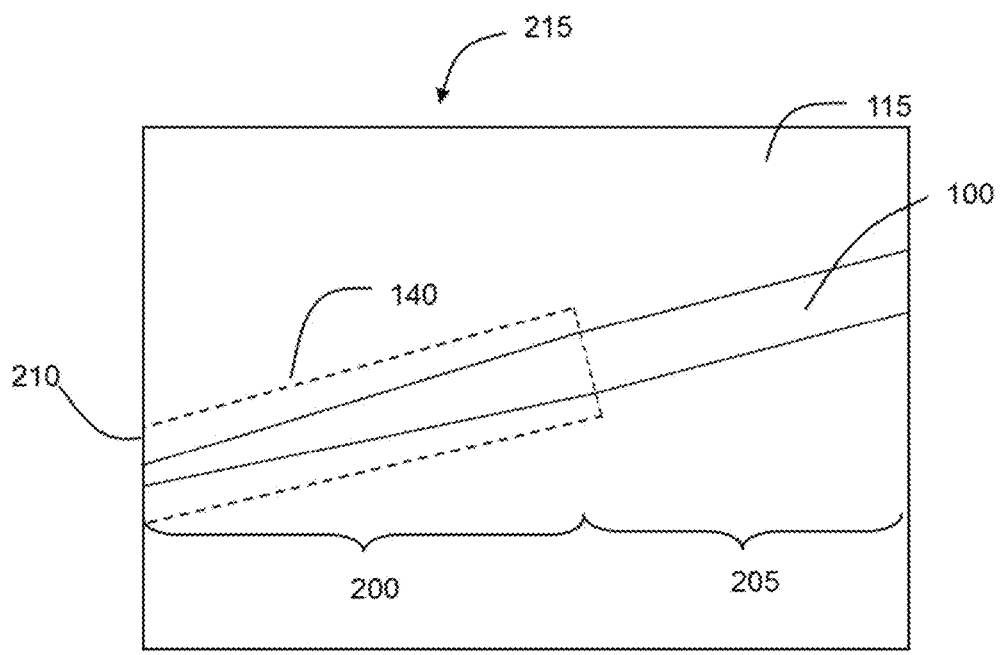
FIG. 2 shows the coupled waveguide apparatus of FIG. 1 in plan view.

Referring to FIGS. 1 and 2, planar waveguide apparatus providing mode expansion according to an embodiment of the invention comprises a ridge waveguide 100 above a buried rib 140. The ridge waveguide 100 provides part of an active device of known type, such as a laser or optical amplifier, and the buried rib 140 provides a passive waveguide. In plan view, it can be seen that the ridge waveguide 100 has a tapered section 200 through which the transverse dimension of the waveguide 100 changes. Where the waveguide 100 is relatively wide, the device will carry a small optical mode 105 centered roughly on the active layer 120, but where the waveguide 100 has tapered to a relatively narrow transverse dimension, the optical radiation in the device will be coupled down (in known manner) to provide a larger, passive mode 110.

In general, "planar waveguide apparatus" is a term describing a device or assembly having one or more layers providing wave-guiding properties. Such apparatus is usually but not essentially constructed by methods such as epitaxy or coating which lay down material onto an existing substrate.

In the following description, the ridge waveguide 100 is described generally as having an active layer 120 and/or as providing at least part of an active device. This is not essential however. The upper waveguide 100 may equally provide at least part of a passive device and the active layer 120 is perhaps more properly described as a core layer 120 and may comprise passive rather than active material.

The word "active" in this context is intended to describe materials or devices that provide optical gain, in use. Conversely, passive materials do not provide optical gain in use. Core and cladding layers of a waveguide have different refractive indexes, in use to provide guiding to an optical mode propagating in the waveguide to follow, and be at least substantially guided by, a core layer. The material of a core or cladding layer may comprise more than one different material or material type.

It is not essential that the upper waveguide 100 is a ridge waveguide. Other structures might be used for the upper waveguide 100, such as a buried heterostructure or buried rib. These would be suitable for devices where the passive buried rib 140 has a break or unguided portion in it, or where the buried rib 140 is used to route light away from the upper waveguide 100. Such embodiments are further described below with reference to FIGS. 11 and 12.

Referring to FIG. 1, the waveguide apparatus is provided as a chip based on an n-doped indium phosphide (InP) substrate 135. This carries an n-doped InP buffer layer 130 on which there is a rib 140 of Q 1.125 material with a thin n-doped InP cap layer. "Q 1.125" in this context stands for a quaternary material having an energy gap cut-off wavelength ($\lambda g$) of 1.125 micrometers ($\mu m$). These are known semiconductor materials containing four different elements, in this case indium, gallium, arsenic and phosphorus. The buried rib 140 is buried in a further n-doped InP buffer layer 125 on which there is an active layer 120 with a Q 1.07 etch stop layer 115.

The design of the active layer 120 will usually be determined by the device it is intended to be part of and might for example have a multiple quantum well (MQW) structure for use in a SOA or semiconductor laser.

The ridge waveguide 100 above the active layer 120 is primarily a p-doped InP cladding layer 145 with a p++-doped cap layer 150 of indium gallium arsenide (InGaAs).

In practice, it will be understood that one or more of the layers may itself comprise sub-layers. For example, the lower cladding or buffer layer 130 can include thin layers of higher index material to help achieve a desired mode shape, a simple example of which is shown in the outrigger layer 400 described below in relation to FIG. 4.

Referring to FIG. 2, in plan view it can be seen that the ridge waveguide 100 comprises a parallel-sided region 205, which terminates in a tapered portion 200 over the buried rib 140. The ridge waveguide 100 and the buried rib 140 are axially parallel and the ridge waveguide 100 is centrally placed over the buried rib 140. The parallel-sided region 205 might provide an active core for a device such as a semiconductor optical amplifier (SOA) or a laser. Additional layers to complete such a device are shown in, and further described below with reference to, FIG. 6.

Figure 6:
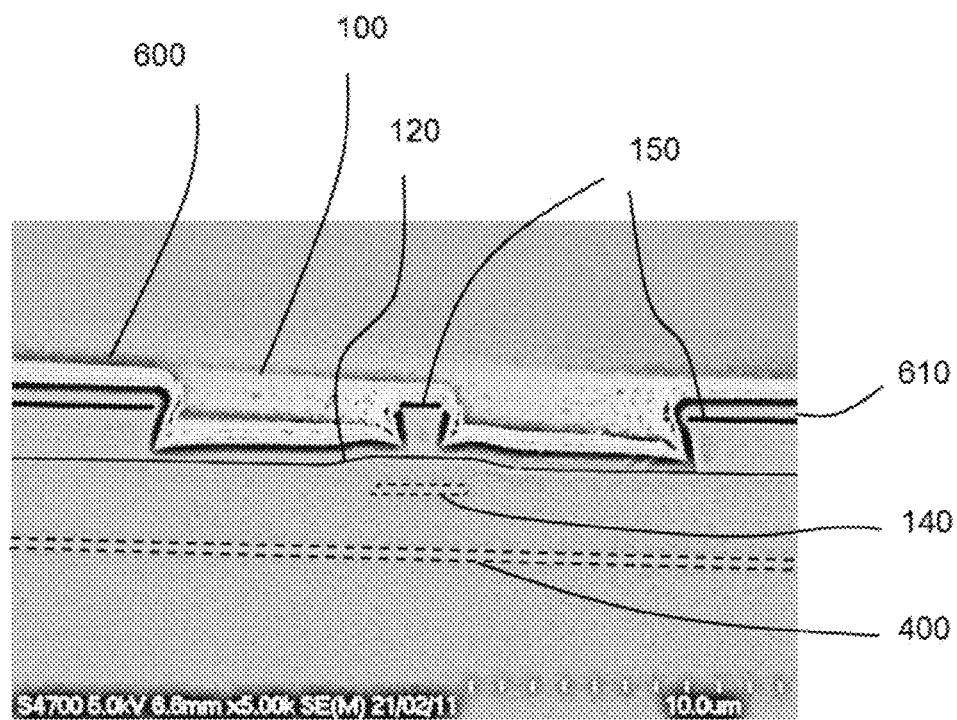
FIG. 6 shows a scanning electron microscope image of a vertical transverse cross section through the first embodiment with additional layers.

Overall, the combination shown in FIG. 2 with the additional layers of FIG. 6 provides a chip 215 comprising an active device based on the active core provided by the parallel-sided region 205 of the ridge waveguide 100, the active device (in use) being optically coupled to a mode expander provided by the tapered portion 200 of the ridge waveguide 100 and the buried rib 140. The chip 215 is cleaved as a rectangle but, in this embodiment, the ridge waveguide 100 is angled across it to produce an angled end facet 210 as an optical output for the mode expander 200, buried rib 140 with reduced reflectivity, for example at 10°. The angled end facet might be used for example where the active device 205 is a SOA to improve performance.

Figure 3A:
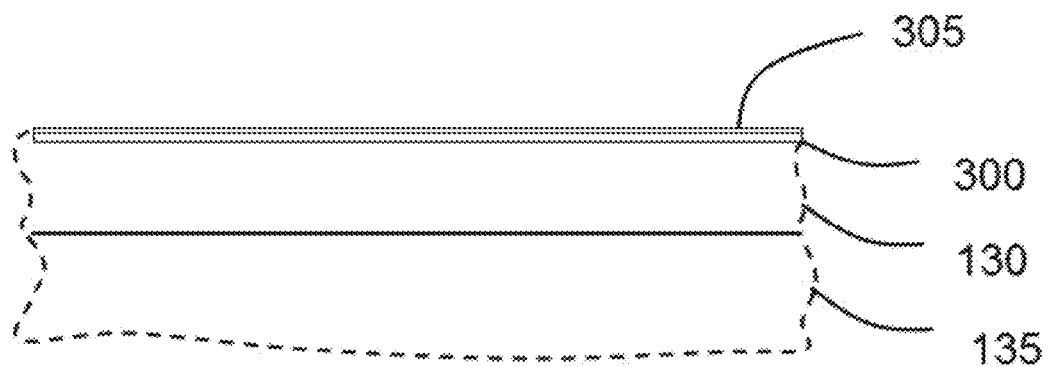
FIGS. 3A to 3D show vertical transverse cross sections through the waveguide apparatus of FIG. 1 during a series of steps during fabrication.
Figure 3B:
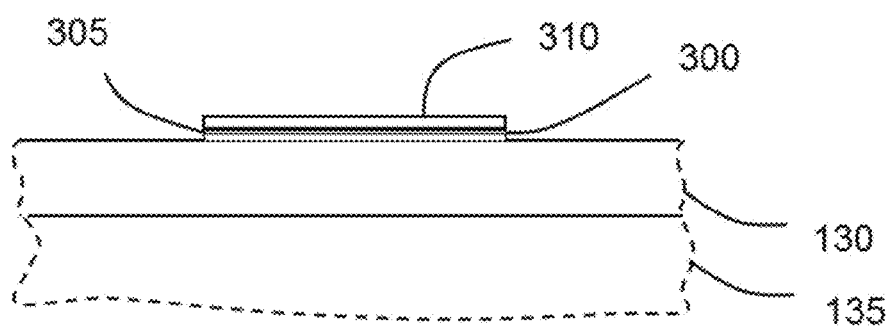
Figure 3C:
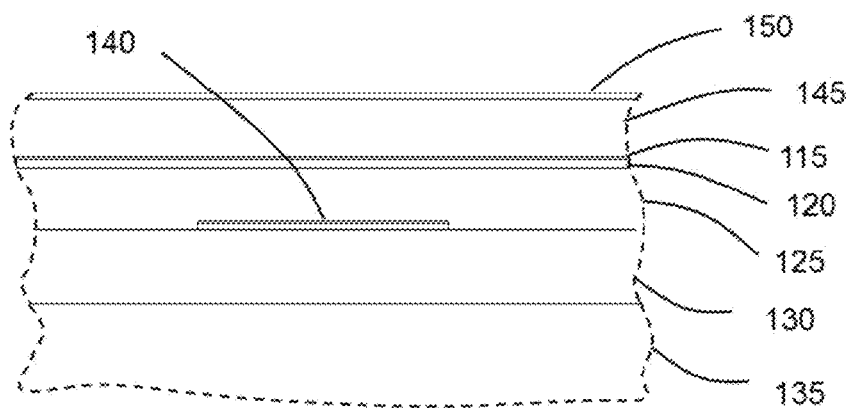
Figure 3D:
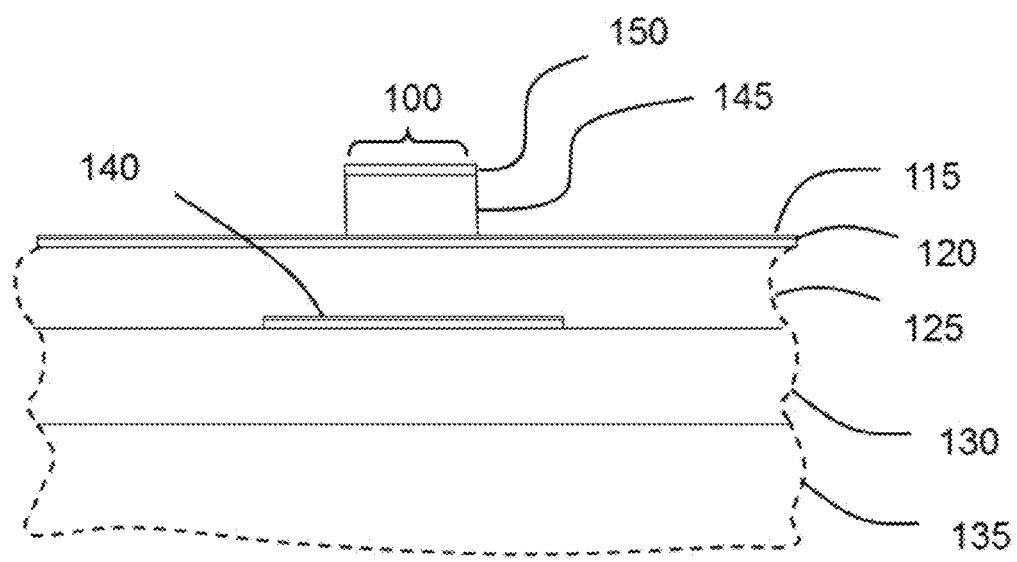

Referring to FIG. 3, steps in a method of making the waveguide apparatus are as follows:

FIG. 3A: creating an initial wafer on the InP substrate 135 by depositing the n-doped InP buffer layer 130 followed by a thin guide layer 300 of Q 1.125 material with a thin n-doped InP cap layer 305;

FIG. 3B: patterning the wafer using an oxide cap 310 and etching to form a shallow rib of the guide and InP cap layers 300, 305;

FIG. 3C: having removed the oxide cap 310, overgrowing to form the rib 140 buried by layers for constructing a full laser or SOA, these layers comprising the n-doped InP buffer layer 125, the active layer 120, the Q 1.07 etch stop layer 115, the p-doped InP cladding layer 145 and the cap layer 150;

FIG. 3D: patterning and etching through the upper p-doped InP cladding layer 145 and the cap layer 150 to form the tapered ridge waveguide 100, the width of the ridge determining the mode position when the waveguide apparatus is in use.

This design approach, in which the active layer 120 is not etched, has an additional benefit where the active layer 120 comprises an aluminum-based, multiple quantum well (MQW) material such as indium gallium aluminum arsenide (InGaAlAs) known as an aluminum quaternary or Al Q material. Cutting this active material type close to a region where forward bias current is supplied in use of the device is a possible reliability hazard. In embodiments of the invention, it is not necessary to cut the active layer 120 close to the areas where current is supplied, unlike known ridge waveguide mode expanders such as that described in U.S. Pat. No. 6,229,947.

Alternative structures for the active layer 120 could be used, such as a bulk layer or MQW structure made from indium gallium arsenide phosphide (InGaAsP). Similarly, the buried rib 140 may have a composite construction. In general, it will usually be necessary to couple optical radiation out of the active layer 120 of a device into another component, and the buried rib 140 provides the alignment key since this defines the position of the output mode.

It is known to model the modes supported by optical structures and several companies offer appropriate software. For example, software for modelling waveguide modes is marketed under the trade mark FimmWave by Photon Design Ltd of Oxford, UK. FimmWave modelling for alternative structures of the active layer 120 has been carried out. Alternative structures modelled were for example:

a four layer quantum well, low confinement active layer suitable for use in high power pump lasers and booster semiconductor optical amplifiers, the active layer confinement factor being around 5% an eight or ten layer quantum well, higher confinement active layer providing more gain, suitable for use in high gain semiconductor optical amplifiers and high speed lasers, the active layer confinement factor being around 20%

Using such modelling, it has been found that a common design for the buried rib 140 passive guide can be used in each case, the geometry of which is determined by the required level of optical mode expansion. Changing the thickness of the active layer 120 simply alters the ridge width at which the mode transfers to the underlying passive structure 140.

Figure 4:
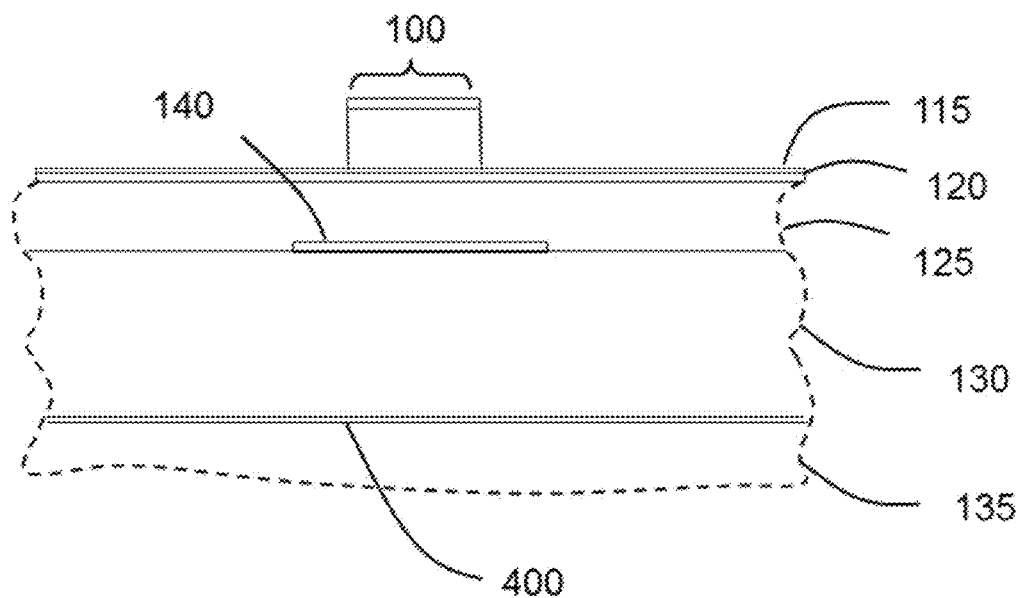
FIG. 4 shows a vertical transverse cross section through a second embodiment of the waveguide apparatus including an outrigger layer.
Figure 5:
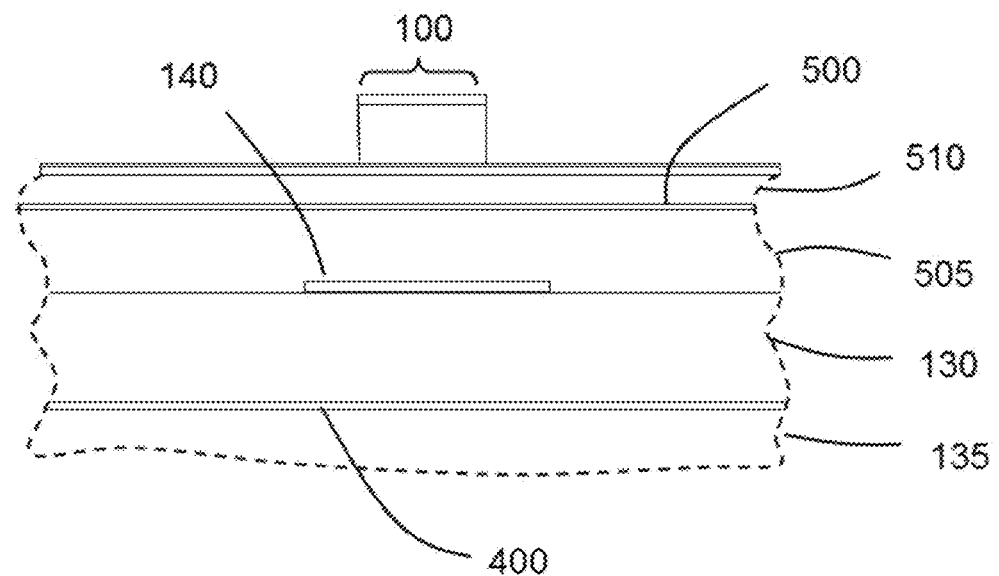
FIG. 5 shows a vertical transverse cross section through a third embodiment of the waveguide apparatus including two outrigger layers.

Referring to FIGS. 4 and 5, a simple buried rib 140 for the passive waveguide may give a relatively circular mode but the addition of thin quaternary outriggers 400, 500 was found to be required to achieve full mode expansion (partial and full mode expansion are discussed below under the heading "COUPLING AND MODE EXPANSION"). Where such layers 400 are required below the buried rib 140, the same composition material is used as the Q 1.125 material of the rib 140 itself. A quaternary outrigger 500 above the rib is composed of Q 1.07 material since this composition is used above the active layer 120 to provide the etch stop for the active ridge 100. Using these compositions is not essential but simplifies the wafer growth stages.

Coupling and Mode Expansion

The degree to which a beam travelling in the active layer 120 couples, or transfers, into the buried rib 140 and is then mode expanded is determined in known manner by several factors, including the taper design of the ridge waveguide 100 and the dimensions and relative refractive indexes of material structures providing the ridge waveguide 100 and the buried rib passive waveguide 140.

Regarding coupling from the ridge waveguide 100 to the buried rib passive waveguide 140, there is a minimum width of the tapered section 200 of the ridge waveguide 100 at which the ridge waveguide 100 becomes essentially cut off so that the optical radiation is almost entirely transferred to the passive buried rib 140. That is, there is a minimum width to ensure coupling to the passive waveguide structure. This minimum width is determined (in known manner) by the strengths of confinement provided by the ridge waveguide 100 and the buried rib passive waveguide 140 and by the degree of mode expansion required. The nature of the ridge waveguide 100 in terms of materials and dimensions is likely to be at least partially determined by the function it has, for example as a low or high confinement SOA. The design of the passive rib 140 is likely to be at least partly determined by the component to which it will have to deliver the optical beam. Thus, the minimum width of the tapered section 200 has to accommodate these other factors. A general rule is that the minimum width of the tapered section 200 can be larger for a low confinement ridge waveguide arrangement 100 than for a high confinement ridge waveguide arrangement 100.

Regarding mode expansion, looking at the buried rib 140, for given materials the dimensions of the rib 140 determine mode size. These can be selected either to give mode expansion in relation to the mode present in the ridge waveguide 100 or simply to provide a passive waveguide for optical routing between different active elements. If the rib 140 is used for optical routing, a greater thickness or width gives stronger guidance, enabling it to be designed with relatively tighter bends for the same optical loss and with reduced length of the mode transfer section between the ridge waveguide 100 and the buried rib 140. In general, a shallower or narrower rib 140 produces weaker guiding and a larger mode size. A larger mode size however requires a longer mode transfer section between the ridge waveguide 100 and the buried rib 140 to maintain low loss or essentially adiabatic mode transformation.

It will be understood that the width of the buried rib 140 does not have to be constant but may vary, for example to achieve a particular coupling characteristic or spatial changes in coupling. It could also be used to change the mode size in the passive waveguide, for example to act as part of a mode expander or to perform some other function.

Regarding the relative refractive indexes of material structures providing the buried rib 140, again in known manner for waveguides the mode spot size is affected by the difference in refractive index between the rib 140 and the buffer layers 125, 130 around it. A greater difference tends to produce increased guiding and a reduced spot size. The rib 140, as mentioned above, might comprise a quaternary material having an energy gap cut-off wavelength ($\lambda$g) of 1.125 μm. If the material has a higher energy gap cut-off wavelength ($\lambda$g), the refractive index will be higher and the depth of the rib 140 required is reduced to obtain the same mode spot size. This can be advantageous because the depth of the rib 140 can create non-uniformity in the structure above it. It is therefore preferable to keep the rib relatively shallow and a maximum depth of 0.2 μm has been found appropriate in the structure types described as EXAMPLE 1 and EXAMPLE 2 below, although other depths are possible and could be used.

EXAMPLE 1 and EXAMPLE 2 relate to partial mode expansion and full mode expansion by the buried rib 140. Partial mode expansion is aimed at achieving low coupling loss to a lens ended fiber. The rib 140 might have a 16° full width at half maximum (FWHM) far-field diffraction angle, corresponding to a mode size of around 3 μm. The partially expanded mode is optimized for standard packaging where low optical loss is critical to low noise figures for SOAs and to maximizing module output power for lasers. Full mode expansion is optimized for example for coupling to cleaved fiber or to a specified silica waveguide such as 0.75% delta (refractive index difference between core and cladding) passive waveguide. The far-field angle in this case might be around 10° to 12° corresponding to a larger mode size of around 6 μm. The full mode expansion also offers increased alignment tolerance for passive alignment of the rib 140 to another component but the device must be larger to accommodate a longer mode transfer section between the ridge waveguide 100 and the buried rib 140 for a low loss mode expander.

Reference is made in EXAMPLE 1 and EXAMPLE 2 to different types of SOA as follows:

SOA-L—this has a low confinement, four quantum well active layer suitable for high power pump lasers and booster SOAs (the active layer confinement factor is around 5%).

SOA-S and SOA-NL—these have a higher confinement, ten quantum well active layer providing more gain, suitable for high gain SOAs and high speed lasers (the active layer confinement factor is around 20%).

A low confinement active layer would also be suitable for a high power laser and a high confinement active layer could be suitable for a laser with high modulation bandwidth.

Example 1

Passive Waveguide for Partial Mode Expansion

Referring to FIG. 4, for moderate mode expansion, an outrigger layer 400 may be needed at the base of the initial buffer layer 130 to increase the perpendicular mode size. In an example, a structure uses an n-doped substrate 135 having a doping level 2e18 per cubic centimeter (cm-3), on which is grown a 90 nanometer (nm) thick layer 400 of Q 1.125 μm wavelength followed by a 2.0 μm thick n-doped buffer layer 130 doped to 1.2e18 cm-3 and a 0.16 μm thick rib layer 140 of Q 1.125 having a thin InP cap to protect the rib layer during cool down. This is patterned to a width of 3 μm before growing the upper 1 μm thick n-doped buffer layer 125 followed by the active and cladding layers 120, 115, 145, 150 mentioned in the description of FIGS. 3C to 3D above.

For the four well active of the SOA-L, this requires the tapered section 200 of the ridge waveguide 100 to be tapered down from 3 μm wide at the parallel-sided section 205 to about 0.9 μm before both of the transverse electric (TE) and transverse magnetic (TM) modes transfer to the buried rib 140. For the stronger ten well SOA-S or SOA-NL active layer, the tapered section 200 of the ridge waveguide 100 is tapered down from 1.6 μm wide to around 0.5 μm before both of the TE and TM modes transfer to the buried rib 140.

Once the mode has transferred from either of the four well or ten well structures, the mode size predicted by FIMMWave modelling using a finite difference mode (FDM) solver (provided again by the supplier of FimmWave, Photon Design), expressed in known manner as degrees FWHM (full width at half maximum) in the far field of the optical mode emitted by the buried rib 140 at an exit facet of the chip, is as shown in Table 1. The results are of standard type, based on measurements relating to the mode in directions parallel and perpendicular respectively to the rectangular surface of the buried rib 140 closest to the ridge waveguide 100. The column headed "Para @ 10 deg" gives values for measurements of the mode in the parallel direction but where the longitudinal axis of the buried rib 140 lies at 10° to the exit facet of the chip, thereby reducing reflectivity at the exit facet.

TABLE 1

| | SOA-L active | | | SOA-S active | | |
|---|---|---|---|---|---|---|
| | Para | Para @ 10 deg | Perp | Para | Para @ 10 deg | Perp |
| TE | 11.7 | 13.8 | 16.9 | 12.5 | 14.8 | 17.7 |
| TM | 10.4 | 12.3 | 16.1 | 10.4 | 12.3 | 16.3 |
| Average | 11.1 | 13.1 | 16.5 | 11.5 | 13.6 | 17.0 |

Measured data for this partially expanded embodiment shows that in practice the mode size is slightly smaller than the FimmWave modelling predicts. Such data is further discussed below with reference to FIG. 7.

Example 2

Passive Waveguide for Full Mode Expansion

Referring to FIG. 5, for full mode expansion the lower outrigger layer 400 is a 50 nm thick layer of Q 1.125 wavelength, followed by a 3 μm thick n doped InP buffer layer 130, and a 0.1 μm thick Q 1.125 rib layer 140. This is patterned to a width of 4 μm before growing the upper spacer layers which comprise 2 μm of n doped InP as a first buffer layer 505, a 50 nm thick Q 1.07 upper outrigger 500 and a further 1 μm thick n doped InP spacer/buffer layer 510 before growing the active and cladding layers 120, 115, 145, 150 mentioned in the FIG. 3d.

For the SOA-L (kinds of High output power Semiconductor Optical Amplifier) this again requires the ridge waveguide 100 to be tapered down from 3 μm wide at the parallel-sided section 205 providing the active core of the SOA to about 0.9 μm before both of the TE and TM modes transfer to the buried rib 140. For the stronger ten well SOA-S (Kinds of High gain Semiconductor Optical Amplifier) or SOA-NL (non-Linear) active layer constructions, the widths at the parallel-sided section 205 of the ridge waveguide 100, or SOA, start at 1.6 μm and must be tapered down to around 0.4 μm to 0.5 μm before both of the TE and TM modes transfer to the passive buried rib 140.

In both cases, once the mode has transferred the mode size is as shown in Table 2, calculated in the same manner as for Table 1.

TABLE 2

| | SOA-L active | | | SOA-S active | | |
|---|---|---|---|---|---|---|
| | Para | Para @ 10 deg | Perp | Para | Para @ 10 deg | Perp |
| TE | 9.0 | 10.6 | 12.1 | 8.9 | 10.5 | 11.9 |
| TM | 8.6 | 10.2 | 11.9 | 8.6 | 10.2 | 11.8 |
| Average | 8.8 | 10.4 | 12.0 | 8.8 | 10.4 | 11.9 |

Referring to FIGS. 2 and 6, an image made using a scanning electron microscope close to the chip's output facet 210 shows the tapered portion 200 of the ridge waveguide 100 at close to its narrowest value, for example less than 1.0 μm. For the purpose of clarity, dotted lines have been added to emphasize the positions of the buried rib 140 and lower outrigger 400. As will be understood by those skilled in the art and in accordance with discussion above, the narrowest value is determined by the guiding strength of the passive buried rib 140 and the active device represented by the parallel-sided portion 205 of the ridge waveguide 100 in terms of dimensions and composition. For example, for a low confinement active device, the minimum ridge width can be larger than for a high confinement active device.

Additional layers shown in FIG. 6 are a contact layer 150 at the top of the ridge waveguide 100 (referred to above as a cap layer 150 with regard to FIGS. 1, 3C and 3D), a silica masking/passivation layer 610 in the areas away from the ridge waveguide 100 and a p-side metal contact 600 of known type for use with InP-based lasers or SOAs, comprising layers of titanium, platinum, titanium again and gold.

Figure 7:
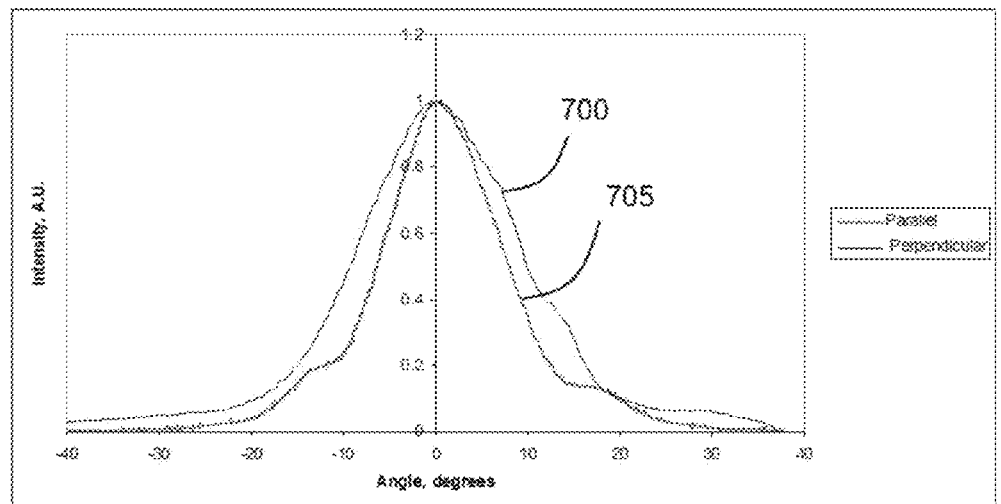
FIG. 7 shows mode field data in use of the waveguide apparatus of FIG. 6.

Referring to FIG. 7, mode size measurements for a chip of the type shown in FIG. 6 were taken, based on the farfield angle (FWHM), for a waveguide 100 angled at 10° to the exit facet 210 of the chip with a SOA-L type active layer construction. The data was obtained at 20 degrees Celsius (° C.) and 400 milliamperes (mA) drive to the ridge waveguide 100. Results are shown for the parallel and perpendicular directions across the ridge waveguide 100. The parallel curve 605 shows the mode farfield angle (FWHM) as about 15° and the perpendicular curve 600 shows the mode farfield angle (FWHM) as about 19°.

Applications

Embodiments of the invention support mode expanded ridge waveguide devices in general but have particular advantages in chips comprising Al Q actives in improving reliability and high temperature operation.

Altering the width of the ridge waveguide 100 can extend the technology to the integration of various active components by transferring the mode to an underlying low loss guide between device sections. Further, if regrown doped layers, such as p-doped layers, are removed between device sections, very high electrical isolation between regions can potentially be provided.

Figure 8:
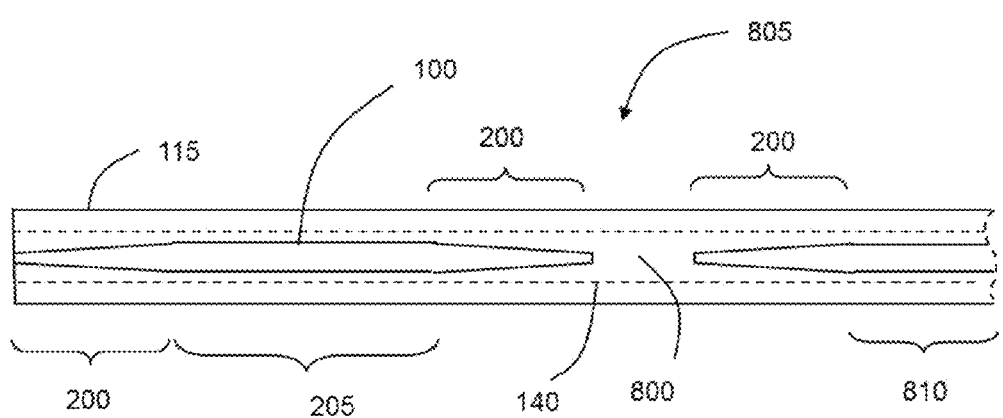
FIG. 8 shows in plan view a fourth embodiment of the waveguide apparatus, this incorporating an isolation region.

Referring to FIG. 8, an integrated chip 805 carries devices based on the active core provided by the ridge waveguide 100. A first device incorporates a first parallel-sided region 205 of the ridge waveguide 100 and a second device incorporates a second parallel-sided region 810 of the ridge waveguide 100. Inputs and outputs to the devices are provided by tapered sections 200 of the ridge waveguide 100 for coupling into or out of an underlying passive waveguide 800. The two device regions 205, 810 are isolated by the reduction in width of the ridge waveguide 100 between them. In FIG. 8, this is shown as a gap but, for optical purposes, in practice it may only be necessary to taper the ridge waveguide 100 to a width significantly below a cut-off point in terms of carrying a mode or part of a mode. A physical gap is however required to provide electrical isolation.

Figure 9:
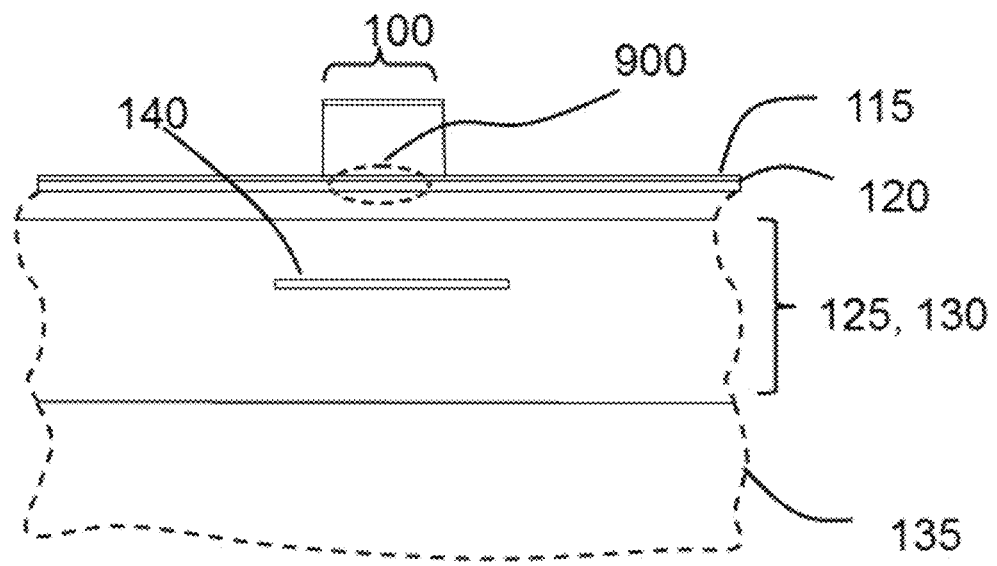
FIGS. 9 and 10 show core and parasitic modes in the waveguide apparatus.
Figure 10:
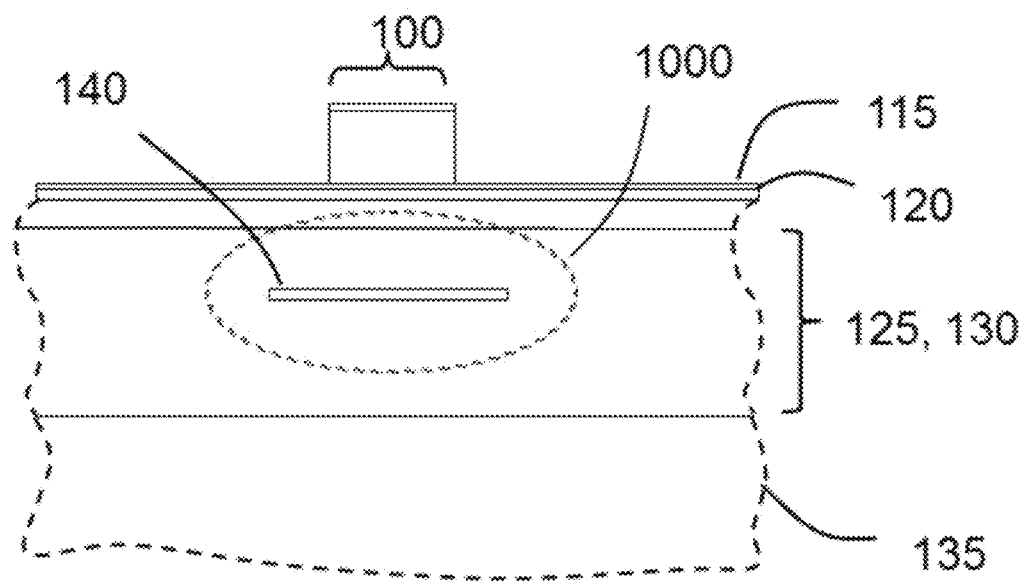

Referring to FIGS. 9 and 10, using the Fimmwave software mentioned above it has been shown that parasitic optical modes can arise in embodiments of the invention, in the same manner as in known ridge waveguide mode expanders. FIG. 9 shows an active core mode 900 (with index 3.202) and FIG. 10 shows a parasitic mode 1000 (with index 3.167) arising in the passive waveguide 140. These parasitic modes can be caused for example by not all of the optical radiation transferring out of the passive waveguide 140 to the upper core guide 120, 100 as the ridge width is increased. While the effects can be reduced by increasing the length of the mode expander or reducing the level of mode expansion, in practical applications they can never be fully removed.

In traditional ridge waveguide devices where the definition of the mode expander and an active device are carried out in layers grown in a single stage of epitaxy, there are limitations to the steps that may be taken to reduce this problem. In embodiments of the invention, the functions of mode expansion and passive waveguiding are split into separate growth stages, which allows for far more flexibility in the designs that can be made to overcome this problem.

Figure 11:
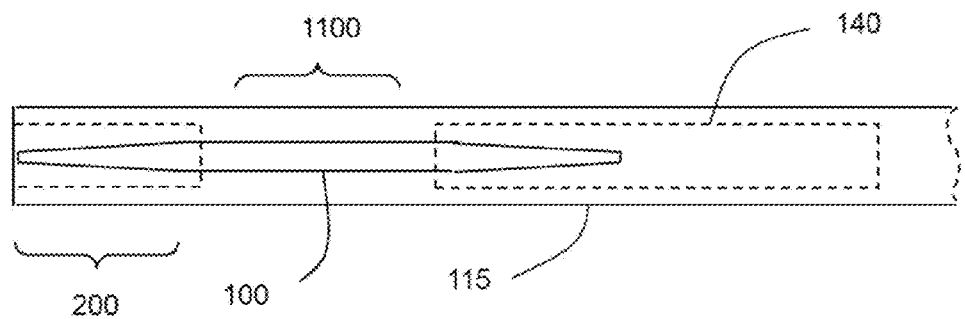
FIG. 11 shows in plan view a fifth embodiment of the waveguide apparatus, this incorporating a break in a lower guide to allow parasitic modes to become unguided.

Referring to FIG. 11, for example the lower passive guide 140 could be removed below the active core region 1100 of a device based on the ridge waveguide 100 such that any parasitic mode becomes unguided. The length of the unguided region would depend on the active core region 1100 and the type of device being made.

Figure 12:
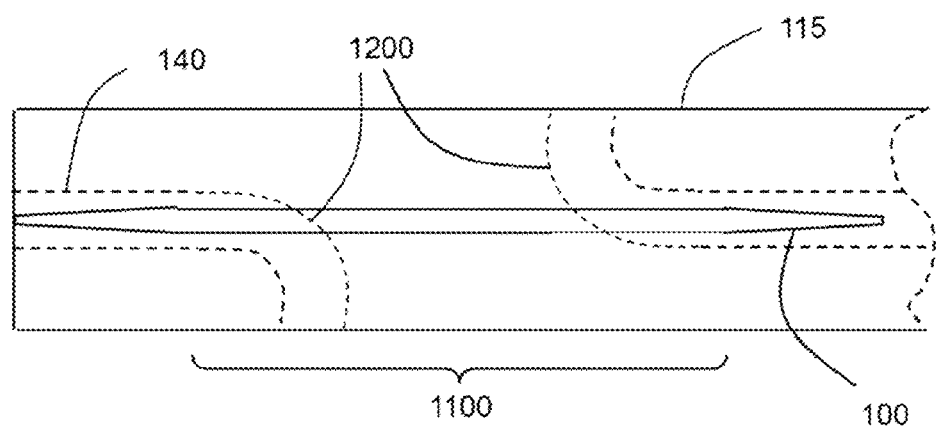
FIG. 12 shows in plan view a sixth embodiment of the waveguide apparatus, this incorporating a curved lower guide to route parasitic modes away.

Referring to FIG. 12, in another alternative configuration the lower guide could be widened and/or designed with curved portions 1200, which guide the parasitic mode away from the active core region 1100. The bend radius needed will depend on the strength of the optical waveguide 140. Hence, if it is not used to make a large mode size the bend radius could be smaller. It is noted that, in many embodiments, the low optical confinement of the passive waveguide 140 means the bend radius would need to be relatively large. For a waveguide 140 offering full mode expansion, the bend radius may need to be perhaps up to 4 millimeters (mm), 5 mm or even more.

Figure 13:
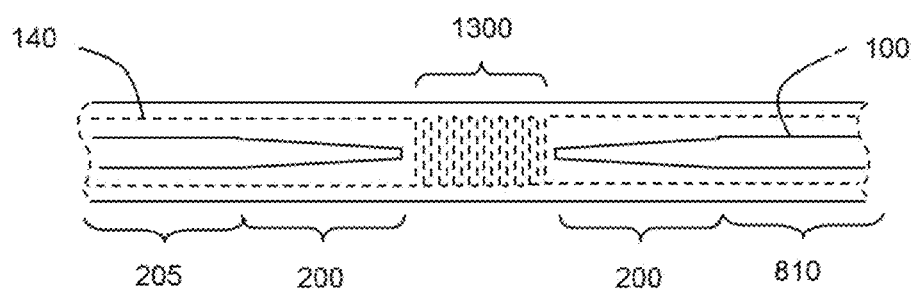
FIGS. 13 and 14 show in plan view the use of gratings for wavelength selection or filtering.
Figure 14:
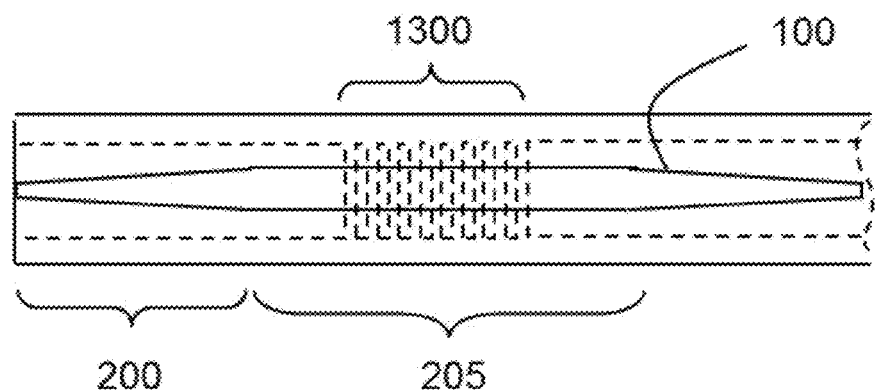

However separating out the passive guide growth from the taper and active core also opens up the possibility of carrying out more complex optical functions including:
 optical taps where a tapered section 200 of the ridge waveguide 100 is deliberately designed to leave some light in the underlying passive waveguide 140
 wavelength selective elements such as directional couplers to enable coarse wavelength routing Referring to FIGS. 13 and 14, one or more high order gratings 1300 could be provided in the passive buried rib waveguide 140 to provide wavelength selective feedback as a distributed Bragg reflector (DBR), or wavelength selective filtering. FIG. 13 shows a grating 1300 between tapered sections 200 of the ridge waveguide 100, where there is no active core region of the ridge waveguide 100. Here the grating 1300 might act for example as a narrow band filter. FIG. 14 shows a grating 1300 under a device incorporating a parallel-sided region 205 of the ridge waveguide 100. Here the grating 1300 might act for example as a DBR.

Figure 15:
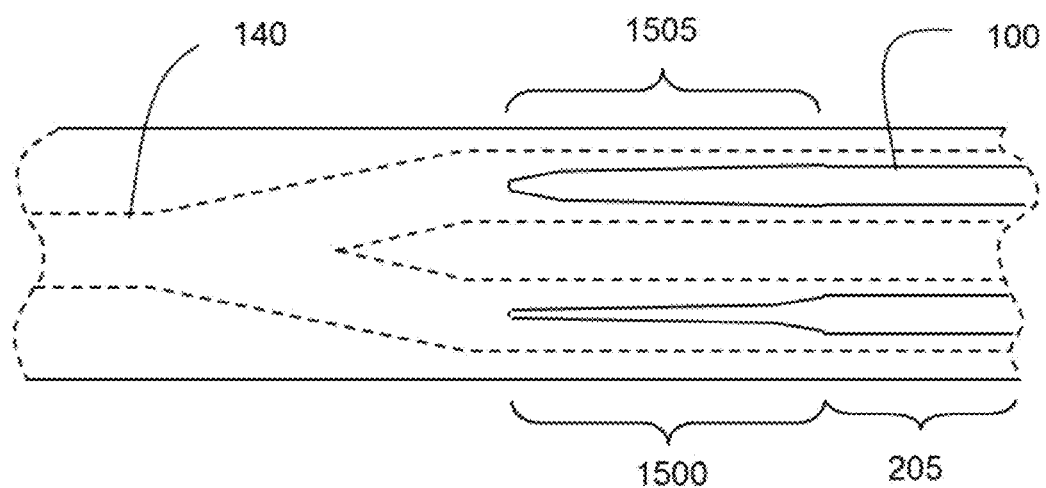
FIG. 15 shows in plan view a configuration offering polarization control.

Referring to FIG. 15, optical radiation can be split at the passive waveguide level, using multimode interference devices (MMIs), directional couplers or "Y" junctions. In FIG. 15, the passive waveguide 140 presents a "Y" junction, having two arms and a signal can be split between them. This can be used for routing or, where the two arms have different characteristics, to provide propagation alternatives.

FIG. 15 shows an example where the two arms have different characteristics. A first arm carries a narrow taper section 1500 of the ridge waveguide 100 and a second arm carries a broader taper section 1505. These different taper sections each support different polarization characteristics. In non-square waveguides, the transverse electric (TE) and transverse magnetic (TM) modes have a different modal index and will thus couple differently between each tapered section 1500, 1505 of the ridge waveguide 100 and the underlying waveguide 140. In general, for an overlying waveguide 100 with a core region that is thinner than the ridge is wide, the TM mode will start to couple down into the passive waveguide 140 first, where the tapered section 1500, 1505 is still relatively wide. In embodiments of the invention as described herein, most of the mode transfer to the underlying passive guide for the TM mode will occur for example where the tapered section 1500, 1505 has a width from 1.8 µm to 1.4 µm while that for the TE mode will occur over the widths from 1.4 µm to 1.0 µm. It is possible then to design each taper to favor coupling of either the TE or the TM mode by selecting a reduced rate of change in width with length over the region where the favored coupling occurs. Thus, each taper will couple one or other of the polarization states more effectively than the other. In FIG. 15, the wider tapered section 1505 would clearly favor the TM mode where the narrower tapered section 1500 would favor the TE mode. If the overlying waveguide 100 is active, it becomes possible to enhance the gain of either the TE or the TM mode by increasing a drive current in the arm designed to favor the chosen mode.

Since the width ranges are fairly close and in some cases the range of widths will overlap it may not be possible to transfer one mode only. However, it is possible to make sure one mode transfers with lower loss than the other. This arrangement is not designed to act as a polarization splitter, but by adjusting the current in the arms carrying the different tapered sections 1500, 1505 it is possible to trim the polarization level by a moderate amount to minimize polarization sensitivity.

FIG. 15 shows reflective routing but it would be possible to use instead a Mach-Zehnder Interferometer (MZI) arrangement.

It might be noted that the passive waveguide 140 in embodiments of the invention does not necessarily provide mode expansion. In the case where the passive waveguide 140 provides routing, it may be preferred to use a strongly guiding passive waveguide 140 because the overall wafer assembly might be made more compact.

Overall, embodiments of the invention offer an alternative platform for monolithic integration and since the passive element is generally going to be either n-type or Fe-doped the material will have a low optical loss. While it does add some growth complexity to what might otherwise be a simple ridge waveguide device, this is undertaken at the start of the fabrication process, which minimizes any cost implications of yield losses.

It is to be understood that any feature described in relation to any one embodiment or aspect of the invention may be used alone, or in combination with other features described, and may also be used in combination with one or more features of any other of the embodiments or aspects, or any combination of any other of the embodiments or aspects, if appropriate. Furthermore, equivalents and modifications not described above may also be employed without departing from the scope of the invention, which is defined in the accompanying claims.

It should be noted that use of words or expressions such as "optical" or "light" in this specification is not intended as a limitation to any particular wavelength range, such as a visible or non-visible wavelength range.

The invention claimed is:

1. A planar waveguide apparatus for coupling optical radiation between waveguides supported by a substrate, the apparatus comprising:
   a passive waveguide comprising a guide layer and cladding material;
   an overlying waveguide at least partially overlying the passive waveguide with respect to the substrate;
   a core layer positioned over the passive waveguide; and
   an etch stop layer positioned on the core layer and under the overlying waveguide,
   wherein the overlying waveguide has at least one tapered section to support the coupling between the overlying waveguide and the passive waveguide,
   wherein the passive waveguide further comprises, in cross section, a rib surrounded on at least four sides by the cladding material to provide a buried rib waveguide,
   wherein the rib comprises the guide layer and a cap layer, and
   wherein the core layer comprises active material to provide optical gain.

2. The planar waveguide apparatus according to claim 1, wherein the overlying waveguide comprises a ridge waveguide.

3. The planar waveguide apparatus according to claim 1, wherein the passive waveguide provides a larger mode size than the overlying waveguide.

4. The planar waveguide apparatus according to claim 1, wherein the propagation directions of the tapered section of the overlying waveguide and a portion of the buried rib waveguide with which coupling occurs are parallel.

5. The planar waveguide apparatus according to claim 1, wherein the guide layer of the passive waveguide comprises a quaternary material.

6. The planar waveguide apparatus according to claim 1, wherein the core layer comprises an aluminum quaternary material.

7. The planar waveguide apparatus according to claim 1, wherein a break or termination in the passive waveguide provides at least one unguided region in relation to the overlying waveguide for reducing or avoiding the propagation of parasitic modes in the underlying waveguide.

8. The planar waveguide apparatus according to claim 7, wherein the break or termination is provided by a break in the rib of the passive waveguide.

9. The planar waveguide apparatus according to claim 7, wherein the at least one unguided region underlies at least one electrically driven region of the overlying waveguide with respect to the substrate.

10. The planar waveguide apparatus according to claim 1, wherein the passive waveguide comprises at least one curved guiding portion for guiding optical radiation away from a propagation direction of the overlying waveguide.

11. The planar waveguide apparatus according to claim 10 wherein the at least one curved guiding portion partially underlies an electrically driven region of the overlying waveguide with respect to the substrate.

12. The planar waveguide apparatus according to claim 10, wherein the passive waveguide includes a grating for use as a filter or distributed Bragg reflector.

13. The planar waveguide apparatus according to claim 1, comprising a further waveguide having a tapered section, wherein the passive waveguide is branched, the tapered section of the overlying waveguide supporting coupling between a first branch of the passive waveguide and the overlying waveguide, and the tapered section of the further waveguide supporting coupling between a second branch of the passive waveguide and the further waveguide.

14. The planar waveguide apparatus according to claim 13, wherein the tapered sections have dimensions selected for carrying different optical propagation modes.

15. The planar waveguide apparatus according to claim 14, wherein the different optical propagation modes comprise different polarization modes.

16. The planar waveguide apparatus according to claim 1, further comprising at least two electrically driven devices, each device comprising a portion of the overlying waveguide and having at least one associated tapered section of the overlying waveguide to support optical coupling with the passive waveguide, wherein electrical isolation between the at least two devices is provided by a break in the overlying waveguide.

17. The planar waveguide apparatus according to claim 16, wherein the break in the overlying waveguide comprises a break in an active core region of the overlying waveguide.

18. The planar waveguide apparatus according to claim 1, wherein the cladding material of the passive waveguide is provided as two or more layers.

19. The planar waveguide apparatus according to claim 1, wherein the cladding material comprises at least one n-doped indium phosphide (InP) buffer layer.

20. The planar waveguide apparatus according to claim 1, wherein the tapered section is tapered to a narrow transverse dimension but is not tapered to a point.

21. The planar waveguide apparatus according to claim 1 further comprising an outrigger layer positioned between the substrate and the passive waveguide.

22. The planar waveguide apparatus according to claim 1, wherein the etch stop layer prevents etching of the active layer.

23. The planar waveguide apparatus according to claim 1, wherein an n-doped indium phosphide (InP) buffer layer is positioned above the rib.

24. The planar waveguide apparatus according to claim 1, wherein the substrate comprises n-doped indium phosphide (InP), wherein the guide layer comprises a quaternary material with an energy gap cut-off wavelength of 1.125 micrometers ($\mu$m), and wherein the etch stop layer comprises a quaternary material with an energy gap cut-off wavelength of 1.07 $\mu$m.

25. The planar waveguide apparatus according to claim 2, wherein the ridge waveguide comprises a p-doped InP cladding layer and a p++-doped cap layer that comprises indium gallium arsenide (InGaAs).

* * * * *